United States Patent
Jeong

(10) Patent No.: US 7,375,969 B2
(45) Date of Patent: May 20, 2008

(54) PLASMA DISPLAY DEVICE

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 283 days.

(21) Appl. No.: 11/348,336

(22) Filed: Feb. 7, 2006

(65) Prior Publication Data

US 2006/0181853 A1    Aug. 17, 2006

(30) Foreign Application Priority Data

Feb. 16, 2005   (KR) ...................... 10-2005-0012657

(51) Int. Cl.
*H05K 7/20* (2006.01)
(52) U.S. Cl. .................. 361/719; 361/704; 165/80.3; 174/16.1; 174/16.3
(58) Field of Classification Search .................. None
See application file for complete search history.

(56) References Cited

U.S. PATENT DOCUMENTS

| 6,366,459 | B1 * | 4/2002 | Katagiri ...................... 361/686 |
| 6,411,353 | B1 * | 6/2002 | Yarita et al. ................... 349/59 |
| 6,522,543 | B2 * | 2/2003 | Kurihara et al. ............. 361/704 |
| 6,774,872 | B1 * | 8/2004 | Kawada et al. ................ 345/60 |
| 6,825,894 | B2 * | 11/2004 | Aoyagi et al. ................. 349/61 |
| 7,218,521 | B2 * | 5/2007 | Kim ........................... 361/704 |
| 7,251,140 | B2 * | 7/2007 | Bae et al. .................... 361/719 |
| 2006/0158835 | A1 * | 7/2006 | Lin et al. ..................... 361/681 |

FOREIGN PATENT DOCUMENTS

| JP | 2000-333190 |   | 11/2000 |
| JP | 2001352022 | A * | 12/2001 |
| JP | 2004126151 | A * | 4/2004 |
| KR | 10-2005-0000617 |   | 1/2005 |

* cited by examiner

*Primary Examiner*—Boris Chervinsky
(74) *Attorney, Agent, or Firm*—Robert E. Bushnell, Esq.

(57) ABSTRACT

A plasma display device for efficiently dissipating heat from a driver IC packaged in a form of a tape carrier package. The device includes a plasma display panel, a printed circuit board assembly, a chassis base having one surface attached to the plasma display panel and another surface adapted to mount the printed circuit board assembly thereon, a TCP (tape carrier package) adapted to electrically connect the printed circuit board assembly to an electrode leading out from the plasma display panel, a driver IC (integrated circuit) arranged on the TCP, the driver IC being adapted to generate and selectively apply a pulse to the electrode leading out from the plasma display panel, a chassis bed arranged at an edge of the chassis base, the chassis bed being adapted to support one side of the driver IC on the TCP, a cover plate adapted to cover another side of the driver IC on the TCP, the cover plate being further adapted to be opposingly arranged at the chassis bed and a heat sink arranged at an outer surface of the cover plate and arranged lengthwise with the cover plate, the heat sink comprising vertical and horizontal air passages.

20 Claims, 12 Drawing Sheets

PLASMA DISPLAY DEVICE

CLAIM OF PRIORITY

This application makes reference to, incorporates the same herein, and claims all benefits accruing under 35 U.S.C. §119 from an application for A PLASMA DISPLAY DEVICE earlier filed in the Korean Intellectual Property Office on 16 Feb. 2005 and there duly assigned Serial No. 10-2005-0012657.

BACKGROUND OF THE INVENTION

1. Field of the Invention

The present invention relates to a plasma display device, and more particularly to a plasma display device that efficiently dissipates heat from a driver IC packaged in a format of a tape carrier package (hereinafter, referred to as "TCP").

2. Description of the Related Art

A plasma display device is an apparatus that displays an image on a plasma display panel (PDP) using plasma generated by a gas discharge. The plasma display device includes the PDP, a chassis base supporting the PDP, and a plurality of printed circuit board assemblies (PBAs). The PBAs are disposed at a side of the chassis base opposite to that of the PDP. The PBAs are electrically connected to display electrodes and address electrodes disposed within the PDP.

In the plasma display device, an electrode printed on the PDP is generally electrically connected to a PBA through a flexible printed circuit (hereinafter, referred to as "FPC"). In other words, a discharge cell in the PDP is addressed by the address electrode and the display electrode provided within the PDP. A sustain discharge subsequently occurs in the addressed discharge cell to realize the image. In order to achieve these, the electrodes provided within the PDP lead out through the FPC and are connected to the PBAs and are thus controlled by the PBAs.

The address electrode is connected to a PBA through a tape carrier package (TCP) that packages the driver IC. An address pulse is applied to the address electrode through the driver IC. In other words, in order to selectively form a wall voltage in a pixel of the PDP, the driver IC repeatedly applies an address pulse to a corresponding address electrode within a short period of time depending on a control signal received from a driving circuit.

As a structure for applying voltage using the FPC and the driver IC, a chip on board (COB), a chip on film (COF), or the TCP type can be used. The COB has a structure for mounting the driver IC on a printed circuit board (PCB), and the COF has a structure for directly mounting the driver IC on a film constituting the FPC. Recently, the TCP, having a small size and a low price, has been used.

The TCP has the following construction. First, a bump of the driver IC is bonded and attached to a pattern. The bump is formed of gold (Au). The pattern is formed of copper (Cu) and is disposed on an insulating film generally formed of polyimide. After that, resin is coated on the bump and the pattern to protect the combination of the bump and the pattern. A pattern protective layer (solder resist) is used to insulate the pattern. The pattern includes a power source, a signal input wire, and a ground wire.

With such an arrangement, the driver IC packaged in the format of a TCP generates an address discharge at least eight times during 1/60 second corresponding to one TV field, in order to express 256 or more grayscales in the PDP. When the PDP is driven, high temperatures and electromagnetic interference (EMI) occurs.

In order to dissipate heat from the driver IC, a heat dissipation sheet, which is formed of a solid material and serves as a heat sink, is attached to the TCP to dissipate heat generated by the driver IC into the atmosphere. However, this arrangement has a drawback in that a large amount of heat produced by the driver IC cannot be endured due to its inability to rapidly dissipate the produced heat. As a result, the driver IC is destroyed. What is needed is a more effective heat dissipation mechanism for such an IC driver located on a TCP.

SUMMARY OF THE INVENTION

It is therefore an object of the present invention to provide an improved design for a plasma display device.

It is further an object of the present invention to provide a design for a plasma display device where there is effective and efficient heat dissipation for a driver IC on a TCP.

These and other objects can be achieved by a plasma display device having a lengthwise heat sink on a TCP cover plate that protects the TCP, thus efficiently dissipating heat from the driver IC.

An exemplary plasma display device according to an embodiment of the present invention includes a plasma display panel, a printed circuit board assembly, a chassis base having one surface attached to the plasma display panel and another surface adapted to mount the printed circuit board assembly thereon, a TCP (tape carrier package) adapted to electrically connect the printed circuit board assembly to an electrode leading out from the plasma display panel, a driver IC (integrated circuit) arranged on the TCP, the driver IC being adapted to generate and selectively apply a pulse to the electrode leading out from the plasma display panel, a chassis bed arranged at an edge of the chassis base, the chassis bed being adapted to support one side of the driver IC on the TCP, a cover plate adapted to cover another side of the driver IC on the TCP, the cover plate being further adapted to be opposingly arranged at the chassis bed and a heat sink arranged at an outer surface of the cover plate and arranged lengthwise with the cover plate, the heat sink comprising vertical and horizontal air passages.

The heat sink can be arranged lengthwise with the cover plate at an opposite outer surface thereof to the driver IC. The vertical and horizontal air passages and a plurality of the heat dissipating fins defining the vertical and the horizontal air passages can be arranged on an outer surface of the heat sink.

Each of said plurality of heat dissipating fins can have a plate-shaped with a rectangular section.

The vertical air passages can have a larger width than the horizontal air passages.

A thickness of each heat dissipating fin can be smaller than a width of the horizontal air passages.

The heat sink can be made of copper.

The horizontal air passages can be produced by a process comprising extruding the heat dissipating fins.

The vertical air passages can be produced by a process comprising cutting the heat dissipating fins at predetermined intervals.

The plasma display device can further include a plurality of screws adapted to attach the heat sink to the outer surface of the cover plate.

The heat sink can be perforated by a connection hole arranged at at least of each corner or a central edge of the heat sink.

The plasma display panel can further include a thermal conduction sheet arranged between the heat sink and the outer surface of the cover plate, the thermal conduction sheet can be adapted to attach the heat sink to the cover plate.

A support jaw can be outwardly protruded from an outer and upper surface of and lengthwise to the cover plate, the support jaw being integrally formed with the cover plate.

The support jaw can have an 'L' shaped side section.

The cover plate and the heat sink can be integrally formed with each other.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
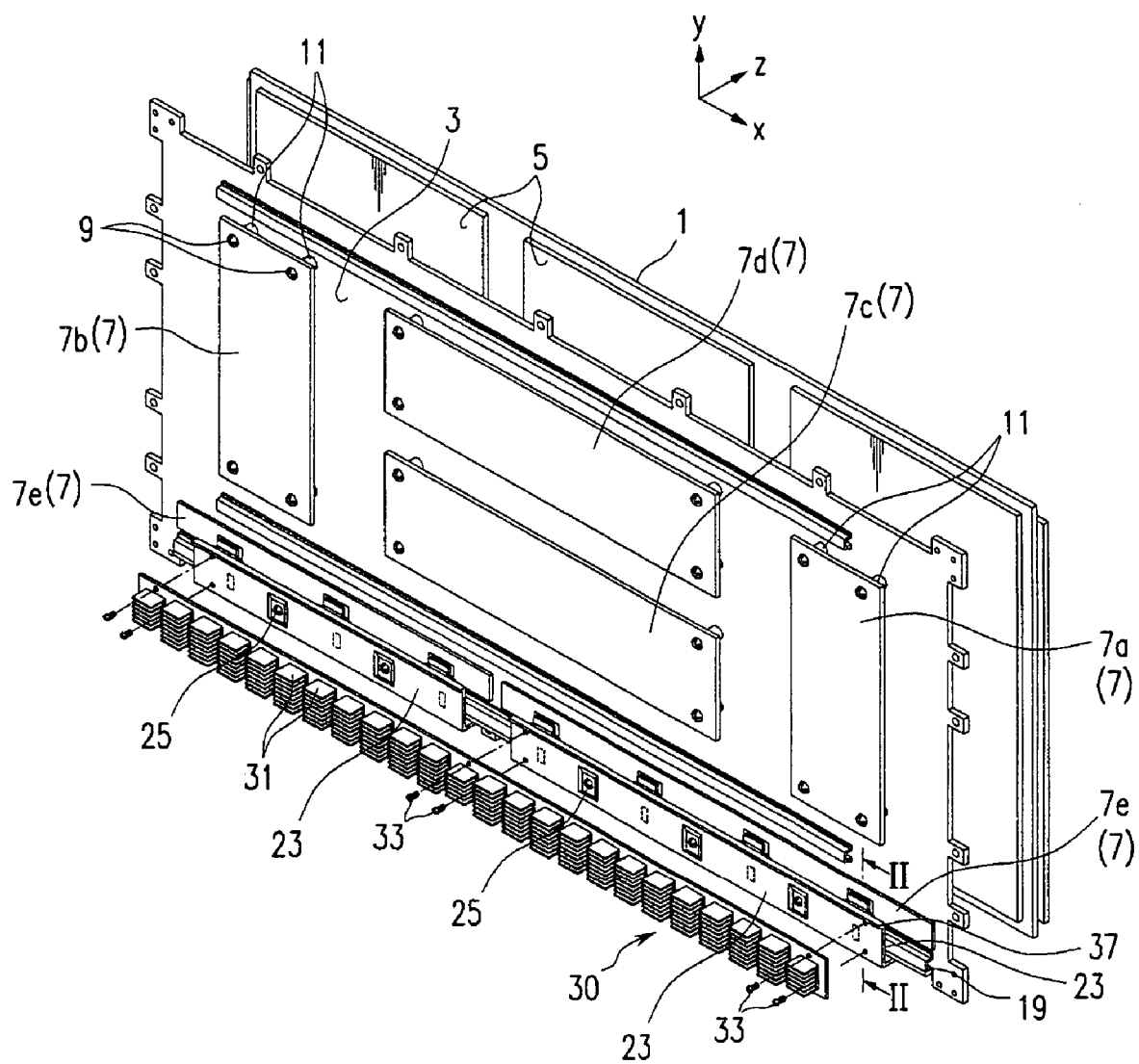
FIG. 1 is an exploded perspective view illustrating a plasma display device according to the first exemplary embodiment of the present invention.
Figure 2:
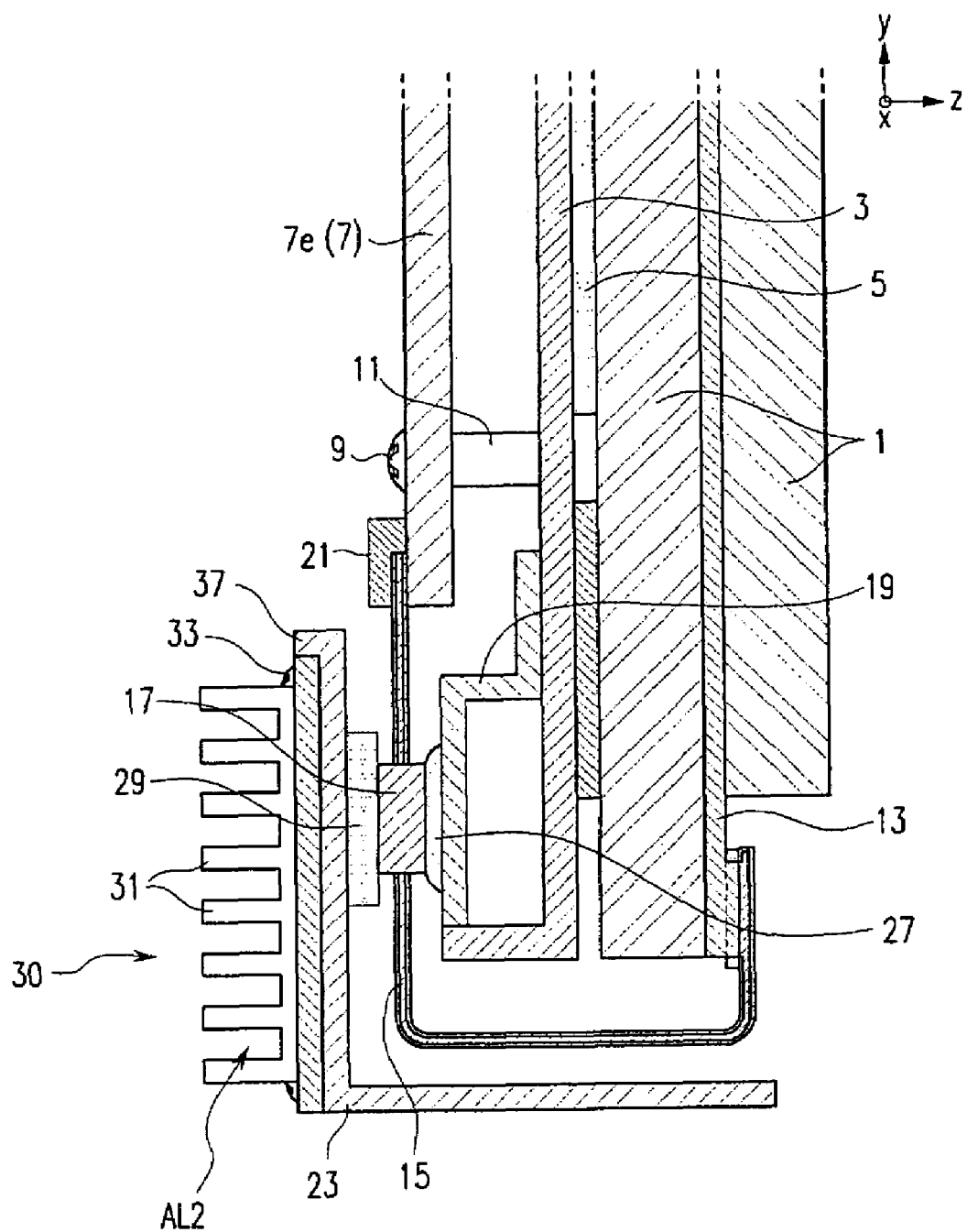
FIG. 2 is a sectional view illustrating an assembly state taken along line II-II of FIG. 1.
Figure 3:
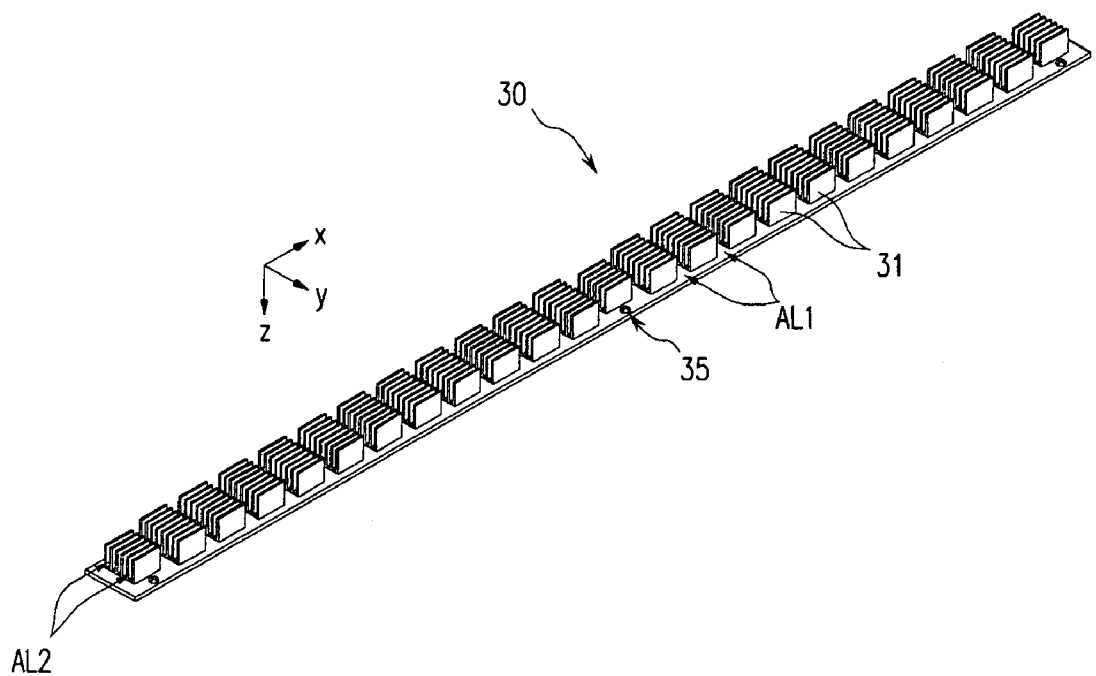
FIG. 3 is a perspective view illustrating a heat sink applied to a plasma display device according to the first exemplary embodiment of the present invention.

Turning now to FIGS. 1 through 3, FIG. 1 is an exploded perspective view illustrating a plasma display device according to the first exemplary embodiment of the present invention, FIG. 2 is a sectional view illustrating an assembly state taken along line II-II of FIG. 1, and FIG. 3 is a perspective view illustrating a heat sink applied to the plasma display device according to the first exemplary embodiment of the present invention.

The inventive plasma display device includes a plasma display panel (PDP)1 and a chassis base 3. The PDP 1 basically has two glass substrates formed as an exterior, and displays an image using a plasma discharge gas. The chassis base 3 dissipates heat from and supports the PDP 1.

A front cover (not shown) is disposed in front of the PDP1, and a rear cover (not shown) is disposed at the rear of the chassis base 3. The front and rear covers are engaged with each other using a chassis screw (not shown).

A heat dissipation sheet 5 can be disposed between the PDP 1 and the chassis base 3. The heat dissipation sheet 5 dissipates the heat from the PDP 1 to the chassis base 3. A filter (not shown) for shielding electromagnetic waves emitted from the PDP 1 is mounted at the front cover (not shown).

Generally, the PDP 1 has a rectangular shape with a larger length in the X-axis direction than in the Y-axis direction of FIG. 1. The chassis base 3 has a rectangular shape corresponding to the PDP 1, and can be formed of a material such as aluminum (Al) having good thermal conductivity.

In other words, the PDP 1 is attached to and supported by one surface of the chassis base 3, and a plurality of printed circuit board assemblies (PBAs) 7 for driving the PDP 1 are mounted on an opposite surface of the chassis base 3. The PBAs 7 are substantially engaged to a boss 11 provided on a rear surface of the chassis base 3 using a setscrew 9.

The PBAs 7 mounted on the rear surface of the chassis base 3 includes an X board 7a, a Y board 7b, an image processing board 7c, a switching mode power supply board 7d, and an address buffer board 7e. The image processing board 7c receives an image signal from the exterior, generates a control signal for driving an address electrode 13 and a control signal for driving a display electrode (not shown) within the PDP 1, and applies the control signals to each of the address buffer board 7e, the X board 7a, and the Y board 7b. The switching mode power supply board 7d wholly supplies power for driving the plasma display device.

FIG. 2 exemplifies a structure for connecting a connector 21 of the address buffer board 7e to the address electrode 13 of the PDP 1 via TCP 15. The TCP 15 for connecting the address buffer board 7e with the address electrode 13 includes a packaged driver IC 17. The driver IC 17 selectively applies an address pulse to the address electrode 13 under the control of the address buffer board 7e.

The chassis base 3 can have a bent shape or can include a chassis bed 19 that provides mechanical rigidity for enduring torsion and bending. As shown in FIG. 2, the chassis bed 19 is disposed to avoid interference with the PBAs 7 that are disposed on the rear surface of the chassis base 3. In FIG. 2, the chassis bed 19 is provided lengthwise (X-axis direction) of and on a rear lower surface of the chassis base 3, such that it corresponds to the TCP 15 connected to the address buffer board 7e and the driver IC 17 packaged in the TCP 15.

A cover plate 23 is mounted at the chassis bed 19, and the TCP 15 and the driver IC 17 are interposed between the chassis bed 19 and the cover plate 23. The cover plate 23 is fixed to the chassis bed 19 using a setscrew 25. The cover plate 23 is divided into two parts and covers the driver IC 17 to isolate the driver IC 17 from the exterior. The cover plate 23 dissipates heat that is generated when driving the driver IC 17 to the exterior. The cover plate 23 can also be configured at a lower end of the chassis base 3, to correspond to each of the TCP 15 and the driver IC 17 situated lengthwise (X-axis direction) along the chassis base 3. As shown in FIG. 1, the cover plate 23 can also be formed in a lengthwise (X-axis) direction along the chassis base 3 and serve to cover a plurality of individual driver ICs.

Thermal grease 27 is interposed between the driver IC 17 and the chassis bed 19, and a thermal conduction sheet 29 is interposed between the driver IC 17 and the cover plate 23. Accordingly, the generated heat is dissipated to the chassis bed 19 and the cover plate 23 through the thermal grease 27 and through the thermal conduction sheet 29.

In the first exemplary embodiment of the present invention, the heat sink 30 of FIG. 3 is used to effectively dissipate the heat passing through a two-part cover plate 23. The heat sink 30 is integrally provided lengthwise along an outer surface of the two-part cover plate 23. Accordingly, air passages AL1 and AL2 are respectively provided in vertical and horizontal directions. In other words, the heat sink 30 is mounted lengthwise along the two parts of the cover plate 23 and on an opposite outer surface of the cover plate 23 from the driver IC 17. On heat sink 30 are a plurality of heat dissipating fins 31 that are designed to have a thickness and a width that provides the vertical and the horizontal air passages AL1 and AL2.

A method of manufacturing the heat sink 30 is as follows. First, the heat sink 30 is extruded with the heat dissipating fins 31 having the horizontal air passages (AL2) formed lengthwise along the heat sink 30. After that, the vertical air passages (AL1) are formed by cutting the heat dissipating fins 31 in a vertical direction at predetermined lengthwise intervals along the heat sink 30. Through this method, the heat sink 30 can be simply manufactured.

The heat sink 30 is engaged to the outer surface of the cover plate 23 using six screws 33. In more detail, the heat sink is perforated by connection holes 35 for the screws 33 the connection holes consuming space in place of heat dissipating fins at the four corners and at both edges at the center of the heat sink 30.

The heat sink 30 is formed of a material having good thermal conductivity such as copper (Cu). In order to quickly dissipate the heat from the driver IC 17, the heat sink 30 is preferably made out of a material having a higher thermal conductivity than that of the cover plate 23 and the chassis bed 19.

The cover plate includes a support jaw 37 that integrally formed at an outer and upper surface along the length of the cover plate 23. The support jaw 37 protrudes outward from the cover plate 23. It is desirable that the support jaw 37 has an 'L'-shaped side section.

The support jaw 37 serves as an assembly reference surface for the heat sink 30 when the heat sink 30 is attached to the cover plate 23. In more detail, the support jaw 37 supports an upper end of the heat sink 30 when the heat sink 30 is assembled to the coverplate 23. The support jaw 37 can also broaden a contact area between the cover plate 23 and the heat sink 30, resulting in improved heat dissipation efficiency.

Figure 4:
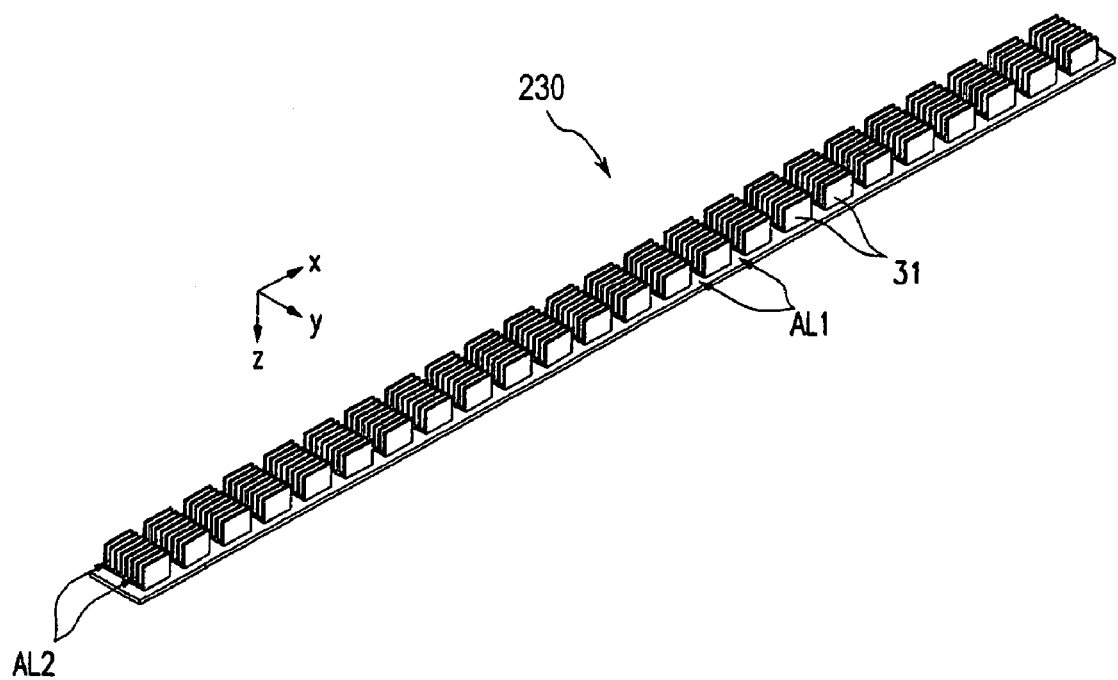
FIG. 4 is a perspective view illustrating a heat sink applied to a plasma display device according to the second exemplary embodiment of the present invention.
Figure 5:
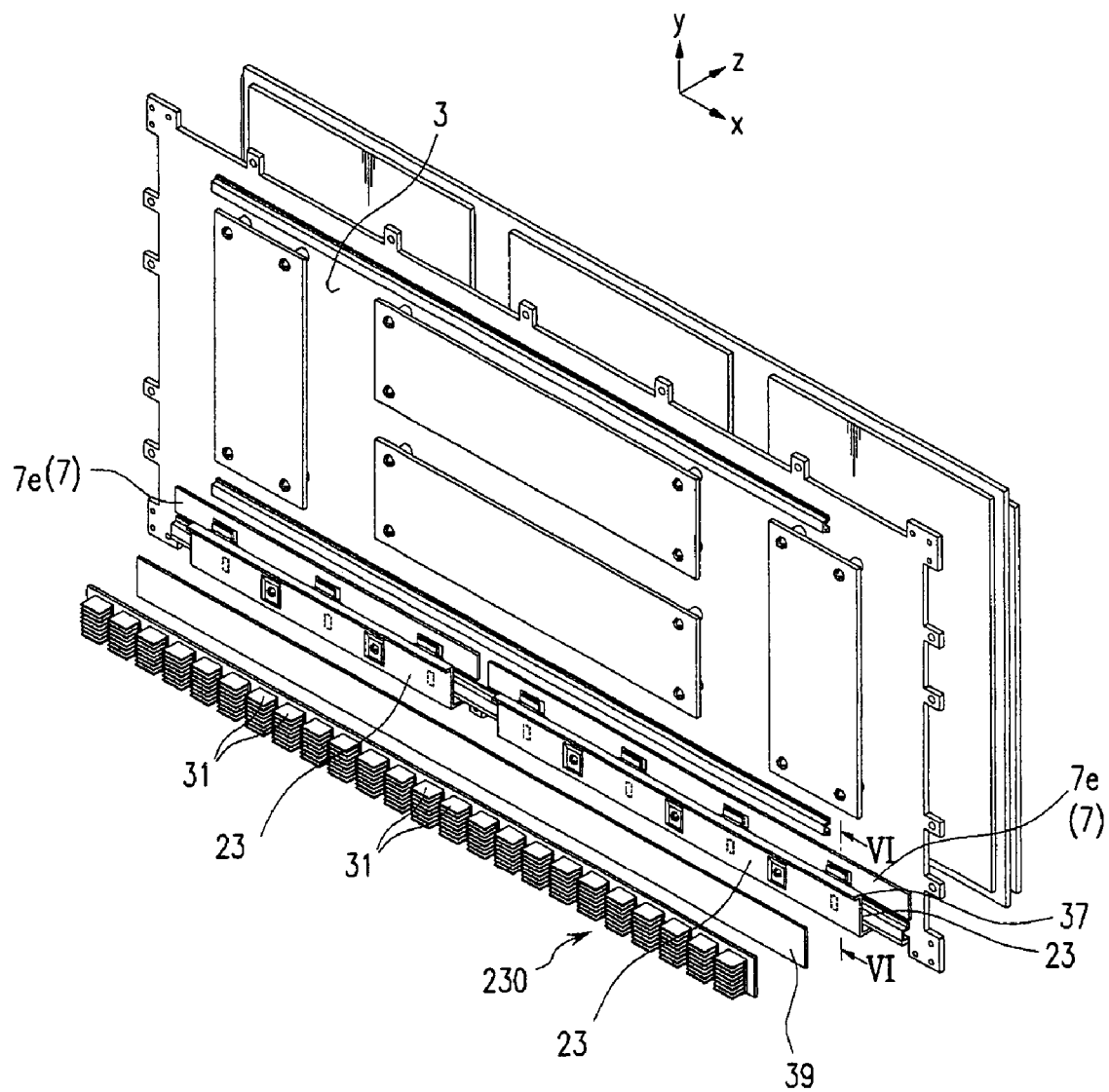
FIG. 5 is an exploded perspective view illustrating a plasma display device according to the second exemplary embodiment of the present invention using the heat sink of FIG. 4.
Figure 6:
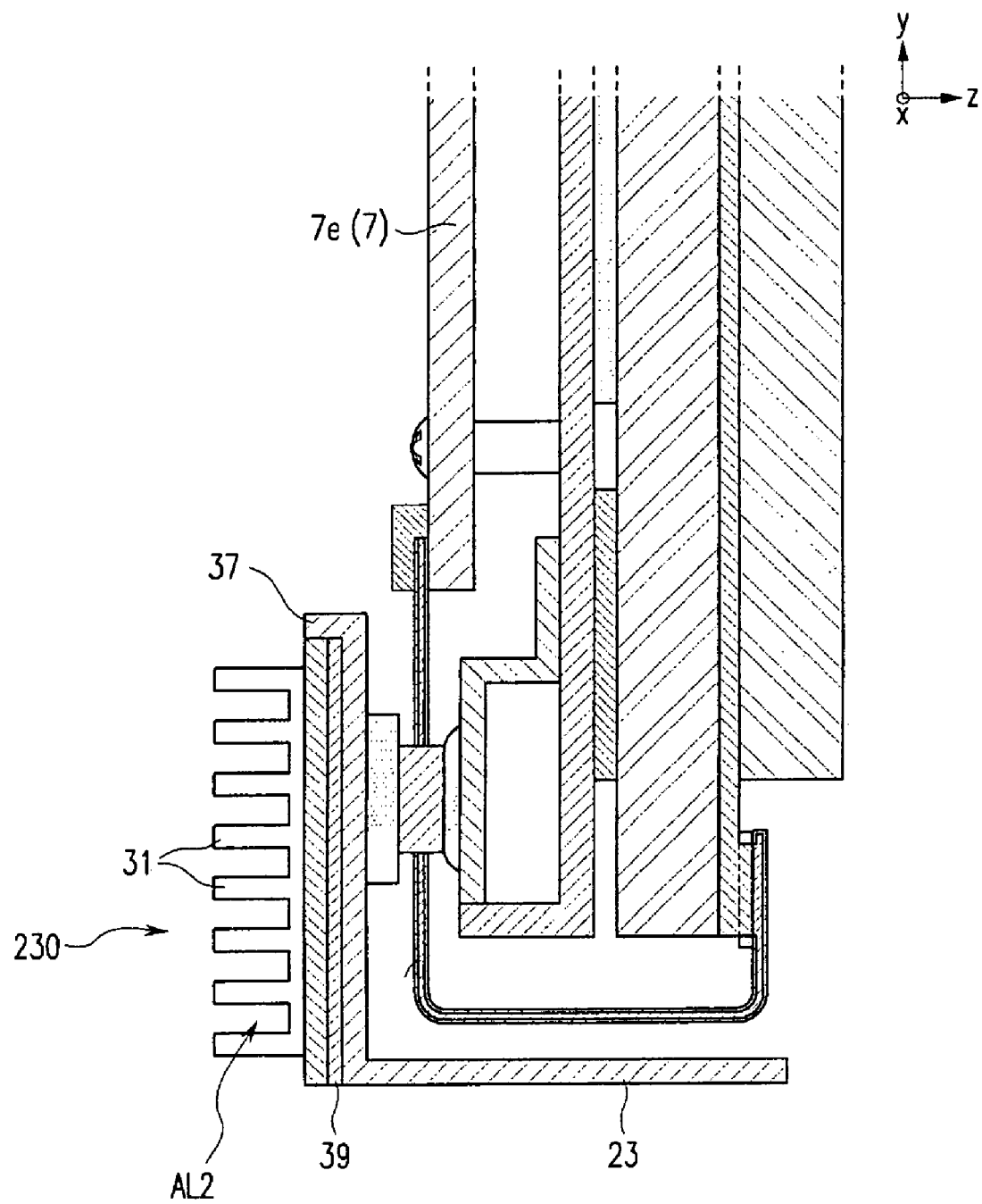
FIG. 6 is a sectional view illustrating an assembly state taken along line VI-VI of FIG. 5.

Turning now to FIGS. 4 through 6, FIG. 4 is a perspective view illustrating a heat sink 230 applied to a plasma display device according to the second exemplary embodiment of the present invention, FIG. 5 is an exploded perspective view illustrating the plasma display device according to the second exemplary embodiment of the present invention using the heat sink 230 of FIG. 4, and FIG. 6 is a sectional view illustrating an assembly state taken along line VI-VI of FIG. 5. Referring to FIGS. 4 through 6, construction of the heat sink 230 applied to the second exemplary embodiment of the present invention will now be described.

As shown in FIG. 4, the heat sink 230 has the same shape as the heat sink 30 applied to the first exemplary embodiment, except that there is no connection holes present in the heat sink 230 according to the second embodiment of the present invention. In place of the connection holes are additional heat dissipating fins 31. Because there are no connection holes in heat sink 230 of FIGS. 4 through 6, a thermal conduction sheet 39 is used instead of screws to attach the heat sink 230 to the cover plate 23 in the second embodiment of the present invention.

Referring now to FIGS. 5 and 6, the heat sink 230 is integrally formed in a lengthwise direction over both parts of the two-part cover plate 23, and is attached to both parts of the two-part cover plate 23. Thermal conduction sheet 39 is interposed between a rear surface of the heat sink 230 and outer surfaces of the two-part cover plate 23. The thermal conduction sheet 39 maintains an adhesive force binding the heat sink 230 to the outer surface of the two-part cover plate 23. Except as described above, the heat sink 230 and the cover plate 23 of the second embodiment have the same basic constructions as that in the first exemplary embodiment.

Figure 7:
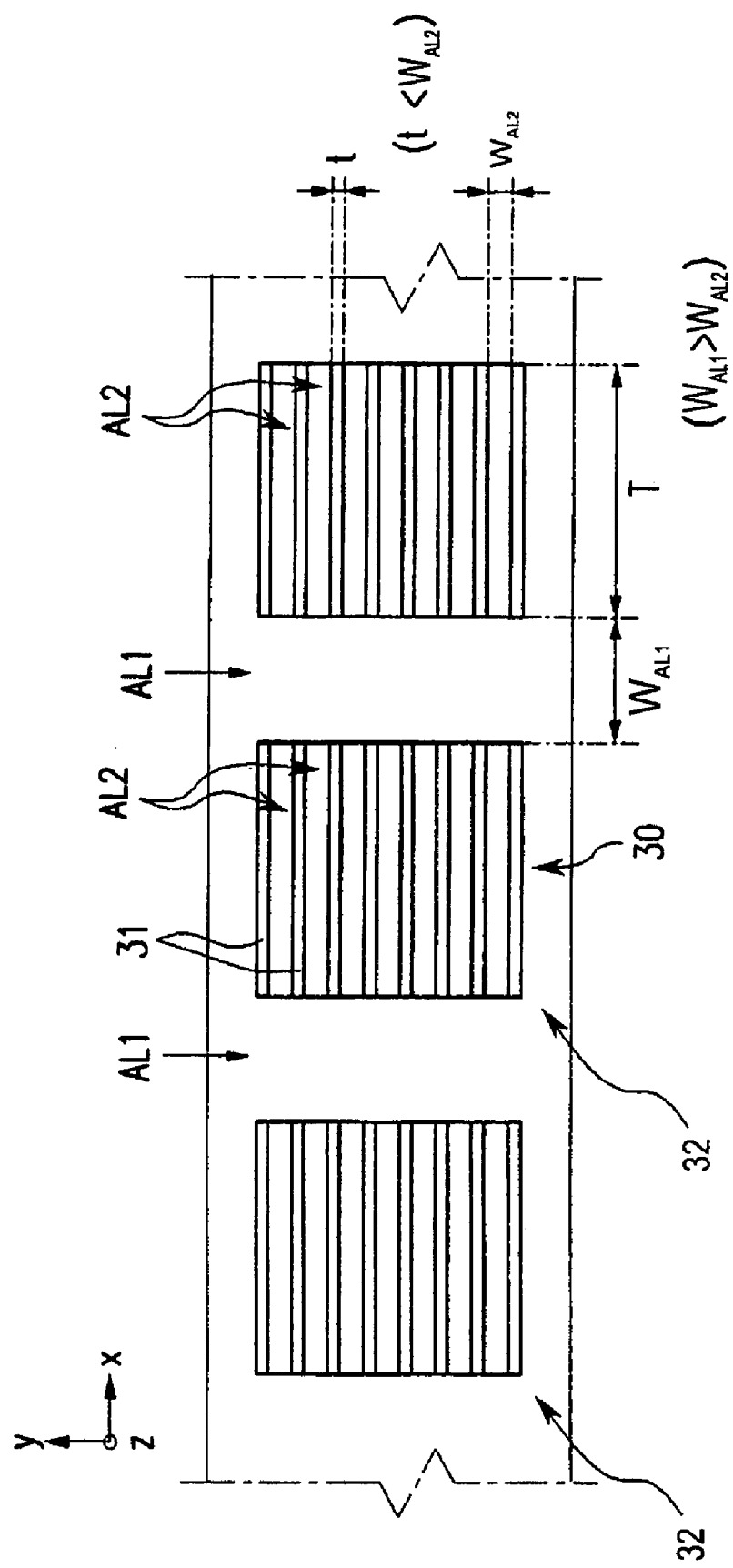
FIG. 7 is a partial plan view illustrating a heat sink applied to an exemplary embodiment of the present invention.
Figure 8:
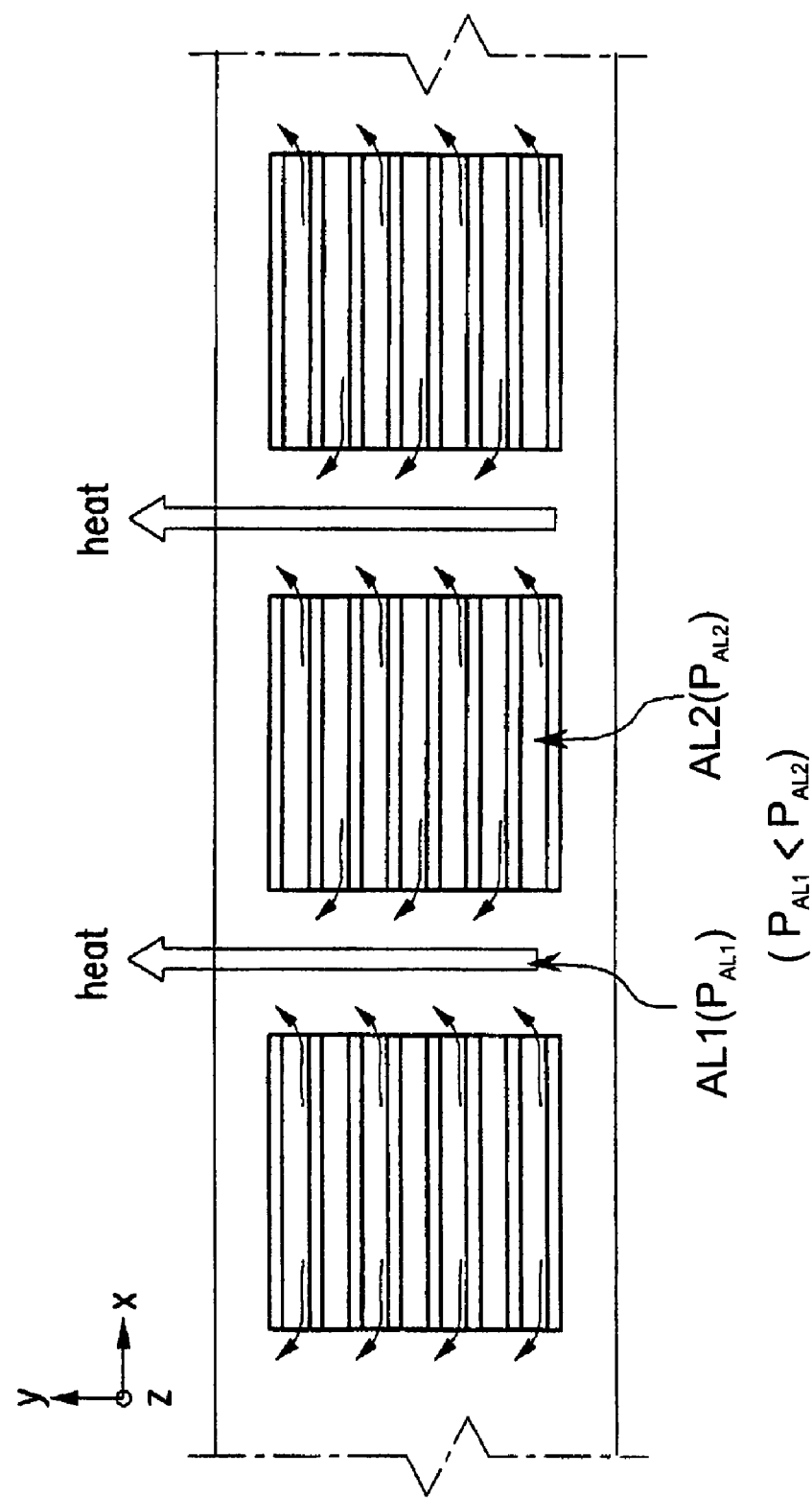
FIGS. 8 and 9 illustrate a principle of heat dissipation of a heat sink according to each exemplary embodiment of the present invention using FIG. 7.
Figure 9:
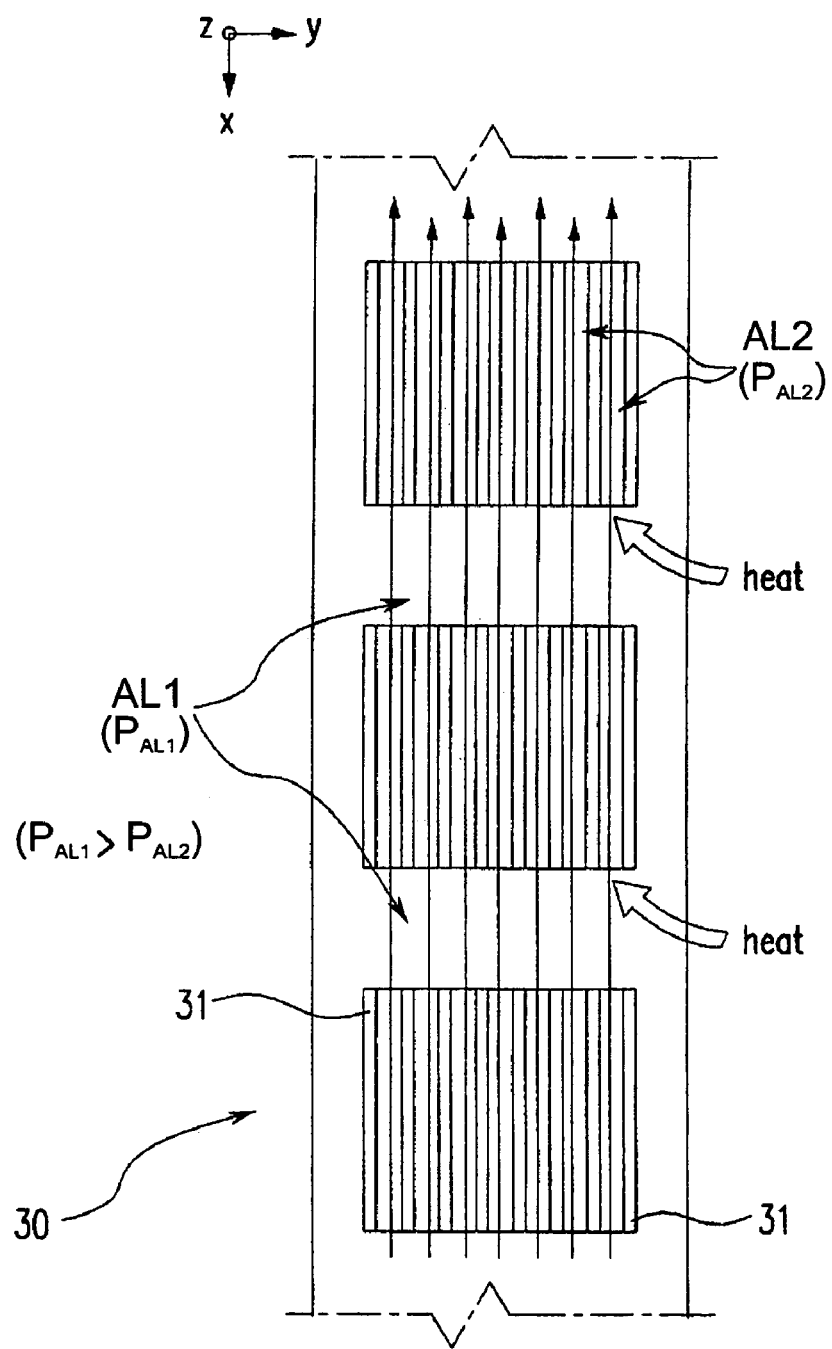

Turning now to FIGS. 7 through 9, FIG. 7 is a partial detailed plan view illustrating a portion of a heat sink applied to the exemplary embodiments of the present invention, and FIGS. 8 and 9 illustrate a principle of heat dissipation of the heat sink according to the exemplary embodiments of the present invention together with FIG. 7. Referring to FIGS. 7 to 9, a detailed construction and principle of heat dissipation of the heat sink 30 applied to the first exemplary embodiment of the present invention will be described. It is to be appreciated that essentially the same principles apply to heat sinks of other embodiments of the present invention, including heat sink 230 of FIG. 4.

First, the heat dissipating fins 31 of the heat sink 30 are plate-shaped to have rectangular sections. Eight heat dissipating fins 31 are arranged and spaced apart from one another in the vertical (Y-axis) direction and extend in the lengthwise (X-axis) direction of the cover plate 23. Accordingly, the horizontal air passages AL2 are formed between individual heat dissipating fins 31.

When the eight heat dissipating fins 31 are defined as one set 32, a plurality of heat dissipating fin sets 32 are arranged and spaced apart from one another along a lengthwise X-direction of the cover plate 23. Accordingly, the vertical air passages AL1 are formed between the heat dissipating fin sets 32.

At this time, an interval AL2 between individual heat dissipating fins 31 and an interval AL1 between the heat dissipating fin sets 32 are determined based on a thickness (t) and a width (T) of the heat dissipating fins 31 respectively. The vertical air passages AL1 have a larger width than the horizontal air passages AL2 (i.e., $W_{AL1} > W_{AL2}$). It is desirable that the thickness (t) of the heat dissipating fins 31 be less than the width ($W_{AL2}$) of the horizontal air passage AL2 (i.e., $t < W_{AL2}$).

As shown in FIG. 8, the above-constructed heat sink 30 generally performs a function of heat dissipation using air convection through the vertical air passages AL1. The horizontal air passages AL2 also allow airflow toward the vertical air passage (AL1) because the pressure $P_{AL1}$ in vertical passages AL1 is less than the pressure $P_{AL2}$ in the horizontal passages AL2 (i.e., $P_{AL1} < P_{AL2}$).

The inventive plasma display device can also have a pivot function where the screen of the plasma display device rotates by 90°. When the screen is rotated and erected at 90°, the heat sink 30 is oriented as in FIG. 9. In FIG. 9, with the display rotated, the vertical air passage AL1 and the horizontal air passage AL2 are exchanged in position.

Accordingly, the function of heat dissipation resulting from air convection is achieved in the horizontal air passage AL2 before the rotation of the plasma display device, and the airflow resulting from the pressure difference ($P_{AL1} > P_{AL2}$) is formed in the vertical air passage AL1 before the rotation of the plasma display device, thus providing the same effect of heat dissipation.

Figure 10:
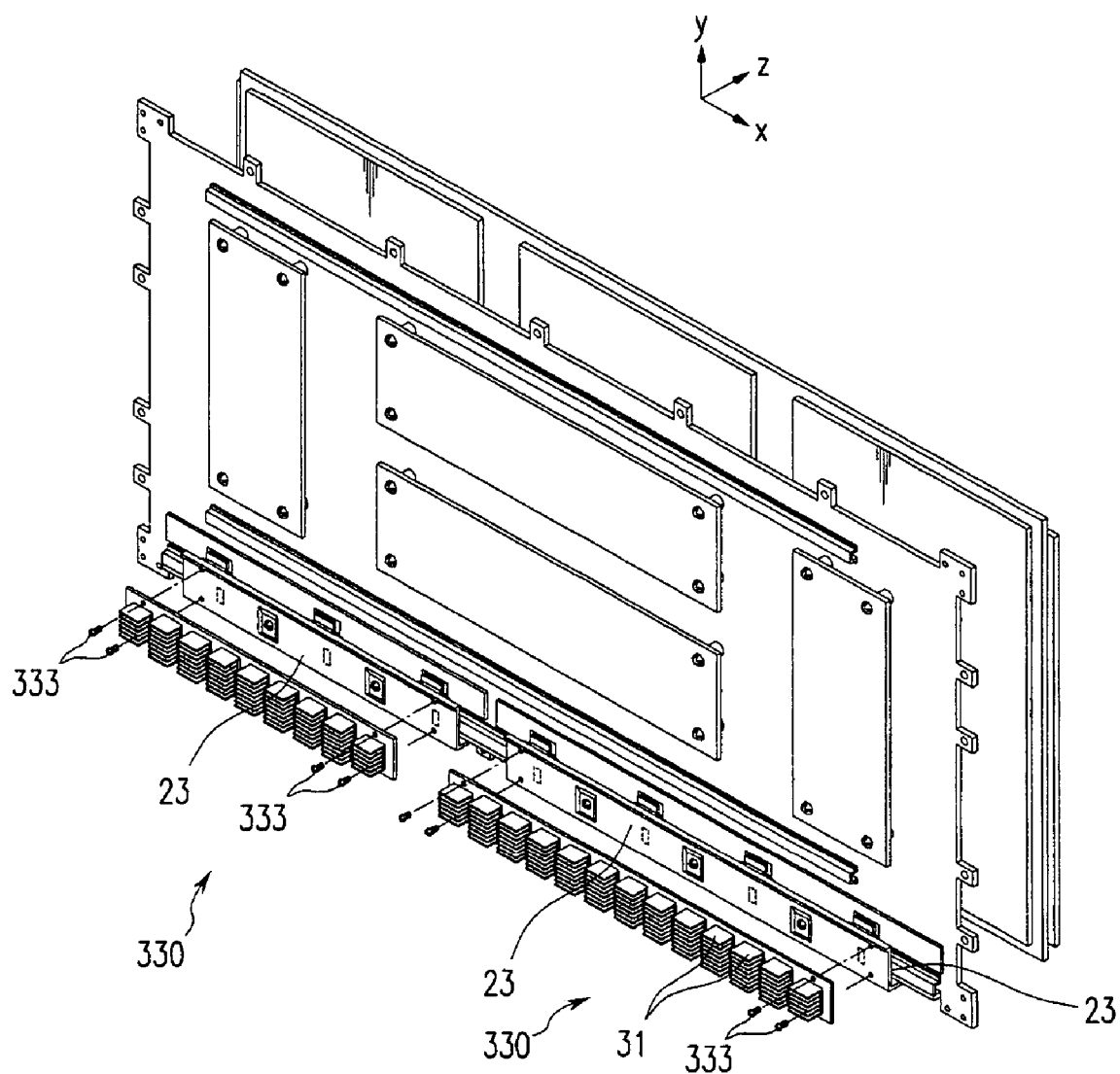
FIG. 10 is an exploded perspective view illustrating a plasma display device according to the third exemplary embodiment of the present invention.
Figure 11:
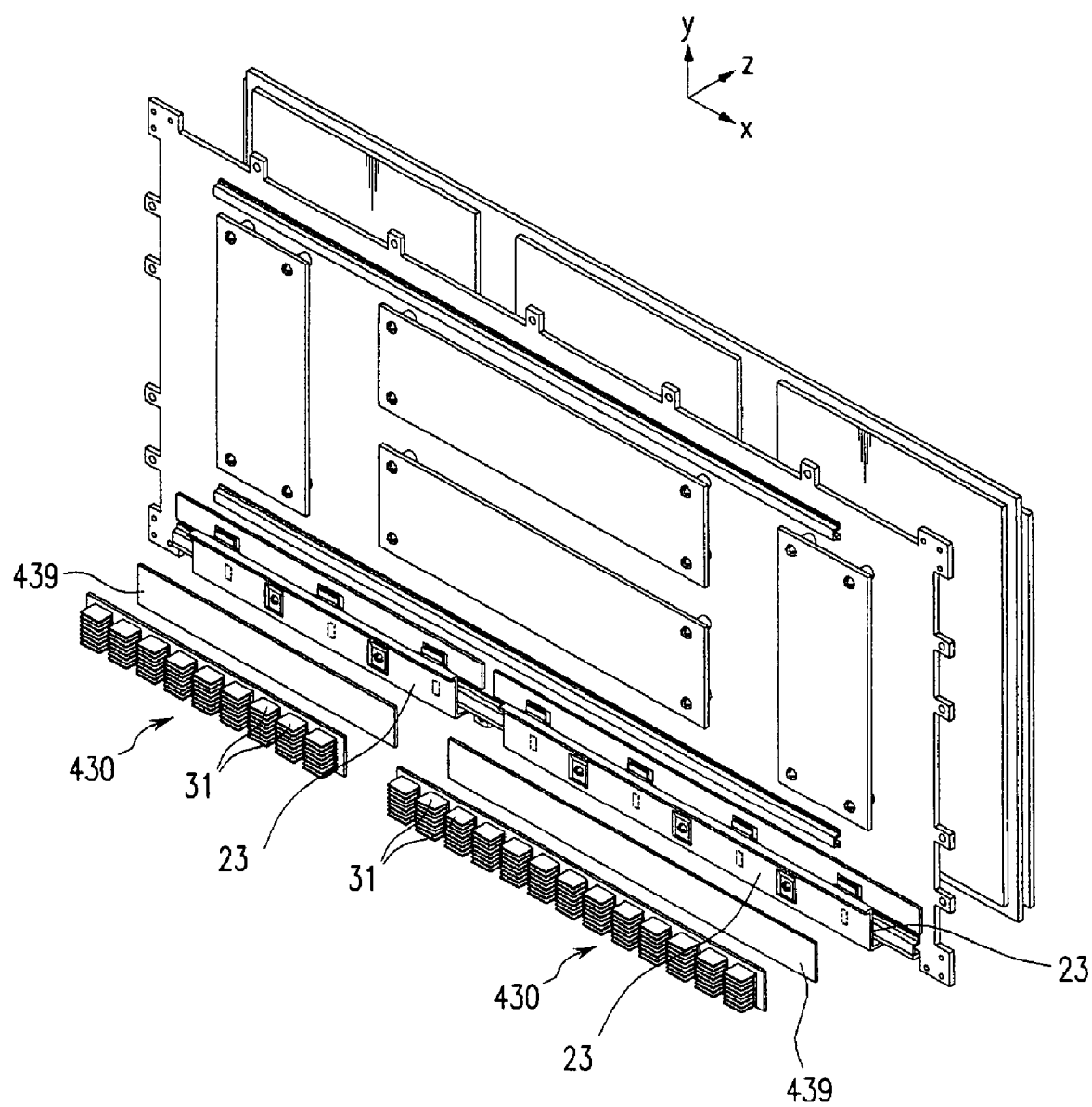
FIG. 11 is an exploded perspective view illustrating a plasma display device according to the fourth exemplary embodiment of the present invention.

Turning now to FIGS. 10 and 11, FIG. 10 is an exploded perspective view illustrating a plasma display device according to the third exemplary embodiment of the present invention, and FIG. 11 is an exploded perspective view illustrating a plasma display device according to the fourth exemplary embodiment of the present invention. Referring to FIGS. 10 and 11, the heat sinks 30 and 230 respectively applied to the first and second exemplary embodiments are now sectioned into to parts to correspond to the two-part cover plates 23. The sectioned parts of the heat sink 330 of FIG. 10 are assembled to cover plates 23 using screws 333, and the sectioned parts of the heat sink 430 of FIG. 11 are attached to the cover plates 23 through thermal conduction sheets 439. The embodiments of FIGS. 10 and 11 seek to overcome the drawback of the heat sinks 30 and 230 whose length is increased causing their carriage and attachment assembly to be difficult. In order to overcome this difficulty, the heat sinks 330 and 430 can each be sectioned with each section being assembled to an appropriate part of the respective two-part cover plates 23.

Figure 12:
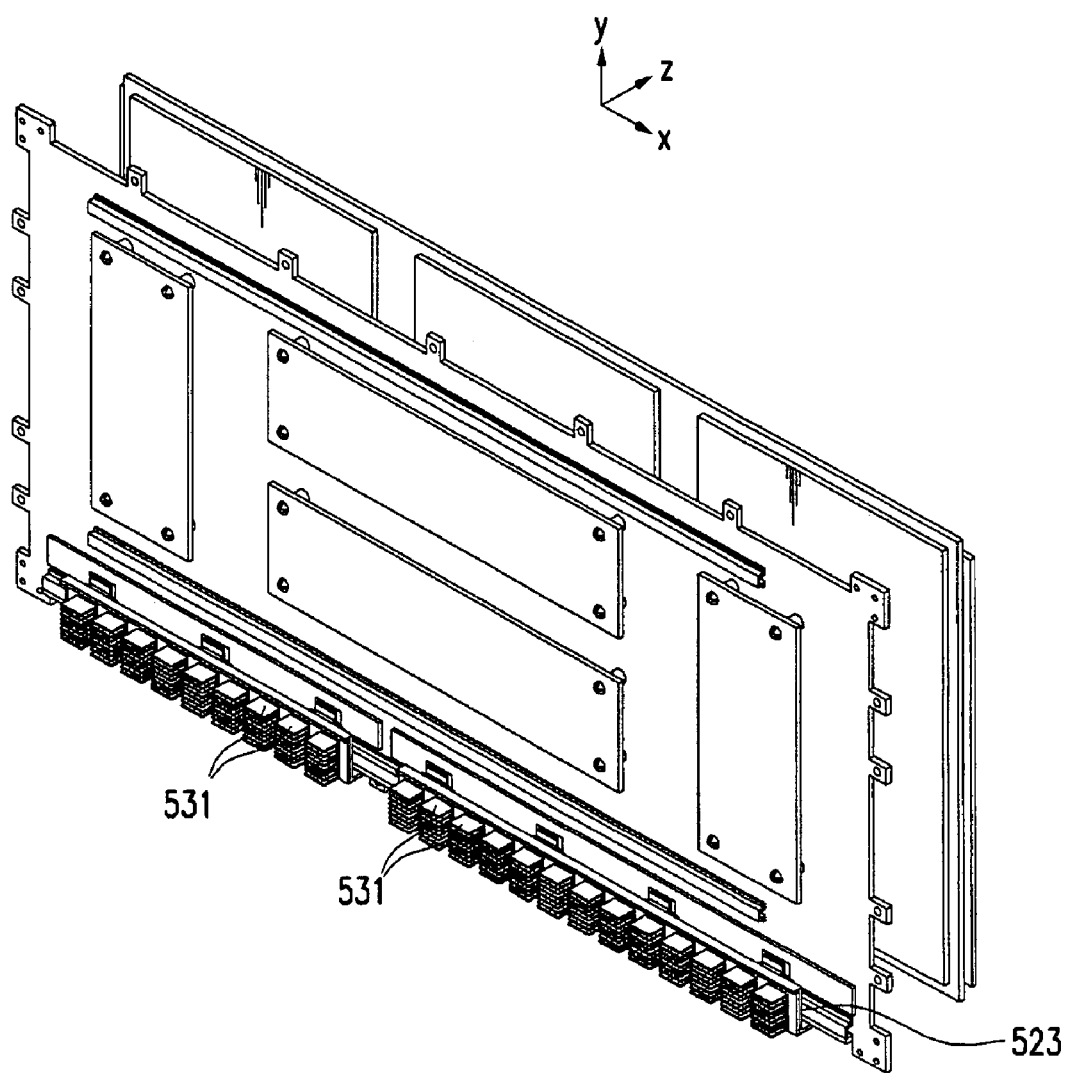
FIG. 12 is an exploded perspective view illustrating a plasma display device according to the fifth exemplary embodiment of the present invention.

Turning now to FIG. 12, FIG. 12 is an exploded perspective view illustrating a plasma display device according to the fifth exemplary embodiment of the present invention. Referring to FIG. 12, heat dissipating fins 531 are integrally formed on an outer surface of a cover plate 523 according to the present exemplary embodiment. In other words, the cover plate 523 and a heat sink are not separately assembled or attached, but are integrally formed. Through the above construction, manufacturing costs can be reduced and an assembly process can be more simplified.

As described above, in the inventive plasma display device, the heat sink is assembled or attached in a lengthwise direction on the cover plate, or is formed integrally with the cover plate so that heat generated by the driver IC can be effectively dissipated using the vertical and horizontal air passages in the heat sink. Further, there is an effect that even when the present invention is applied to a plasma display device having a pivot function, and the plasma display device is rotated and erected at 90°, the same effect of heat dissipation can be obtained.

Furthermore, when the inventive heat sink is manufactured, the heat dissipating fins are extruded lengthwise of the heat sink and then the extruded heat dissipating fins are cut in the direction perpendicular to the length of the heat sink at predetermined intervals. Accordingly, the heat sink can be integrally formed. As a result, the manufacturing costs can be reduced and the assembly process thereof can be simplified. Furthermore, in one embodiment, the cover plate and the heat sink can be integrally formed, thus further simplifying the assembly process.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device, comprising:
   a plasma display panel;
   a printed circuit board assembly;
   a chassis base having one surface attached to the plasma display panel and another surface adapted to mount the printed circuit board assembly thereon;
   a TCP (tape carrier package) adapted to electrically connect the printed circuit board assembly to an electrode leading out from the plasma display panel;
   a driver IC (integrated circuit) arranged on the TCP, the driver IC being adapted to generate and selectively apply a pulse to the electrode leading out from the plasma display panel;
   a chassis bed arranged at an edge of the chassis base, the chassis bed being adapted to support one side of the driver IC on the TCP;
   a cover plate adapted to cover another side of the driver IC on the TCP, the cover plate being further adapted to be opposingly arranged at the chassis bed; and
   a heat sink arranged at an outer surface of the cover plate and arranged lengthwise with the cover plate, the heat sink comprising vertical and horizontal air passages.

2. The device of claim 1, wherein the heat sink is arranged lengthwise with the cover plate at an opposite outer surface thereof to the driver IC such that the vertical and horizontal air passages and a plurality of the heat dissipating fins defining the vertical and the horizontal air passages are arranged on an outer surface of the heat sink.

3. The device of claim 2, wherein each of said plurality of heat dissipating fins is plate-shaped to have a rectangular section.

4. The device of claim 2, wherein the vertical air passages have a larger width than the horizontal air passages.

5. The device of claim 2, wherein a thickness of each heat dissipating fin is smaller than a width of the horizontal air passages.

6. The device of claim 1, wherein the heat sink comprises copper.

7. The device of claim 1, wherein the horizontal air passages are produced by a process comprising extruding the heat dissipating fins, the vertical air passages being produced by a process comprising cutting the heat dissipating fins at predetermined intervals.

8. The device of claim 1, further comprising a plurality of screws adapted to attach the heat sink to the outer surface of the cover plate.

9. The device of claim 8, wherein the heat sink is perforated by a connection hole arranged at at least one of each corner and a central edge of the heat sink.

10. The device of claim 1, further comprising a thermal conduction sheet arranged between the heat sink and the outer surface of the cover plate, the thermal conduction sheet being adapted to attach the heat sink to the cover plate.

11. The device of claim 1, wherein a support jaw is outwardly protruded from an outer and upper surface of and lengthwise to the cover plate, the support jaw being integrally formed with the cover plate.

12. The device of claim 11, wherein the support jaw has an 'L' shaped side section.

13. The device of claim 1, wherein the cover plate and the heat sink are integrally formed with each other.

14. A plasma display device, comprising:
   a plasma display panel;
   a chassis base having a front side attached to a rear side of the plasma display panel, the chassis base being adapted to support the plasma display panel;
   a printed circuit board assembly attached to a rear side of the chassis base;

a driver IC (integrated circuit) arranged on a tape carrier package (TCP), the TCP being adapted to electrically connect the printed circuit board assembly to an electrode within the plasma display panel;

a cover plate adapted to cover the driver IC and the TCP and to draw heat away from the driver IC; and a heat sink arranged at an outer surface of the cover plate, the heat sink comprising vertical and horizontal air passages that are adapted to dissipate heat produced by an operation of the driver IC that is drawn through the cover plate.

15. The plasma display device of claim 14, the cover plate comprising two parts arranged end-to-end on the chassis base, the heat sink also comprising two parts that correspond to the two parts of the cover plate.

16. The plasma display device of claim 15, the heat sink and the cover plate being integral and inseparable.

17. The plasma display device of claim 14, each of the heat sink and the cover plate being arranged along one of a longest edge of the chassis base.

18. The plasma display device of claim 14, further comprising a thermal conduction sheet adapted to attach the heat sink to the cover plate.

19. The plasma display device of claim 14, the heat sink comprising a plurality of sets arranged in a line, each set comprising a plurality of heat dissipating fins.

20. The plasma display device of claim 19, the horizontal air passages being between individual ones of said plurality of heat dissipating fins, the vertical air passages being between individual ones of said plurality of sets.

* * * * *